United States Patent
Sheu et al.

(10) Patent No.: US 8,304,262 B2
(45) Date of Patent: Nov. 6, 2012

(54) WIGGLING CONTROL FOR PSEUDO-HARDMASK

(75) Inventors: Ben-Li Sheu, Sunnyvale, CA (US);
Rajinder Dhindsa, San Jose, CA (US);
Vinay Pohray, Pleasanton, CA (US);
Eric A. Hudson, Berkeley, CA (US);
Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/029,824

(22) Filed: Feb. 17, 2011

(65) Prior Publication Data

US 2012/0214310 A1    Aug. 23, 2012

(51) Int. Cl.
*H01L 21/00* (2006.01)
*H01L 21/4763* (2006.01)
*H01L 21/461* (2006.01)
*H01L 21/302* (2006.01)

(52) U.S. Cl. .......... 438/9; 438/8; 438/96; 438/634; 438/689; 438/694; 257/E21.026; 257/E21.038; 257/E21.218; 257/E21.257; 257/E21.577

(58) Field of Classification Search ........... 257/E21.026, 257/E21.038, E21.039, E21.218, E21.257, 257/E21.252, E21.577, E21.579
See application file for complete search history.

(56) References Cited

U.S. PATENT DOCUMENTS

| | | | |
|---|---|---|---|
| 4,855,017 A | 8/1989 | Douglas | |
| 6,833,325 B2* | 12/2004 | Huang et al. | 438/714 |
| 7,053,003 B2 | 5/2006 | Kanarik et al. | |
| 7,241,683 B2 | 7/2007 | Hudson et al. | |
| 7,291,553 B2* | 11/2007 | Chen et al. | 438/637 |
| 7,407,597 B2 | 8/2008 | Kota et al. | |
| 2005/0136682 A1* | 6/2005 | Hudson et al. | 438/714 |
| 2006/0021971 A1 | 2/2006 | Pears | |
| 2007/0026677 A1* | 2/2007 | Ji et al. | 438/689 |
| 2007/0181530 A1 | 8/2007 | Huang et al. | |
| 2008/0176401 A1* | 7/2008 | Chou et al. | 438/694 |
| 2009/0155731 A1 | 6/2009 | Urakawa | |
| 2009/0163035 A1 | 6/2009 | Romano et al. | |

* cited by examiner

*Primary Examiner* — Mohsen Ahmadi
(74) *Attorney, Agent, or Firm* — Beyer Law Group LLP

(57) ABSTRACT

A method for etching features in an etch layer. A conditioning for a patterned pseudo-hardmask of amorphous carbon or polysilicon disposed over the etch layer is provided, where the conditioning comprises providing a fluorine free deposition gas comprising a hydrocarbon gas, forming a plasma from the fluorine free deposition gas, providing a bias less than 500 volts, and forming a deposition on top of the patterned pseudo-hardmask. The etch layer is etched through the patterned pseudo-hardmask.

17 Claims, 11 Drawing Sheets

WIGGLING CONTROL FOR PSEUDO-HARDMASK

BACKGROUND OF THE INVENTION

The present invention relates to etching an etch layer through a mask during the production of a semiconductor device. More specifically, the present invention relates to etching a dielectric layer through a pseudo-hardmask, such as amorphous carbon or polysilicon during the production of semiconductor devices. Amorphous carbon is a deposited high temperature carbon layer using a deposition process, such as chemical vapor deposition (CVD) with some hydrogen. Such amorphous carbon layers may be deposited at temperatures greater than 400° C.

During semiconductor wafer processing, features of the semiconductor device are defined in the wafer using well-known patterning and etching processes. In these processes, a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed, resulting in a patterned photoresist mask. The pattern may be transferred from the patterned photoresist mask to a pseudo-hardmask layer, which may use an intermediate hardmask layer. Thereafter, the wafer is etched to remove the underlying material from the areas that are no longer protected by the pseudo-hardmask, and thereby produce the desired features in the wafer. The use of a pseudo-hardmask allows deeper etching at high resolution.

SUMMARY OF THE INVENTION

To achieve the foregoing and in accordance with the purpose of the present invention a method for etching features in an etch layer. A conditioning for a patterned pseudo-hardmask of amorphous carbon or polysilicon disposed over the etch layer is provided, where the conditioning comprises providing a fluorine free deposition gas comprising a hydrocarbon gas, forming a plasma from the fluorine free deposition gas, providing a bias less than 500 volts, and forming a deposition on top of the patterned pseudo-hardmask. The etch layer is etched through the patterned pseudo-hardmask.

In another manifestation of the invention a method for etching features in an etch layer is provided. An amorphous carbon layer is formed over the etch layer. An antireflective layer is formed over the amorphous carbon layer. A patterned photoresist layer is formed over the antireflective layer. A pattern of the patterned photoresist layer is transferred to the amorphous carbon layer to form a patterned amorphous carbon mask. A conditioning for the patterned amorphous carbon mask is provided, where the conditioning comprises providing a fluorine free deposition gas comprising nitrogen and a hydrocarbon gas comprising $C_2H_4$ or $CH_4$, forming a plasma from the fluorine free deposition gas, forming a deposition on top of the patterned amorphous carbon mask wherein the deposition has a top thickness, which is a thickness of the deposition on top of the patterned amorphous carbon mask and a sidewall thickness, which is the maximum thickness on sidewalls of the patterned amorphous carbon mask, wherein the top thickness is at least twice the sidewall thickness, etching the etch layer through the patterned amorphous carbon mask, wherein the conditioning and etching are cyclically repeated a plurality of times. The patterned amorphous carbon mask is removed.

In another manifestation of the invention, an apparatus for etching features in an etch layer is provided. A plasma processing chamber is provided, comprising a chamber wall forming a plasma processing chamber enclosure, a chuck for supporting and chucking a substrate within the plasma processing chamber enclosure, a pressure regulator for regulating the pressure in the plasma processing chamber enclosure, at least one electrode or coil for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a fluorine free deposition gas source and an etch gas source. A controller controllably is connected to the gas source, the chuck, and the at least one electrode or coil and comprises at least one processor and non-transient computer readable media. The non-transient computer readable media comprises computer readable code for providing a conditioning for a patterned pseudo-hardmask of amorphous carbon or polysilicon disposed over the etch layer, wherein the conditioning comprises computer readable code providing a fluorine free deposition gas comprising a hydrocarbon gas, computer readable code for forming a plasma from the fluorine free deposition gas, computer readable code for providing a bias less than 500 volts, and computer readable code for forming a deposition on top of the patterned pseudo-hardmask wherein the deposition has a top thickness, which is a thickness of the deposition on top of the patterned pseudo-hardmask and a sidewall thickness, which is the maximum thickness on sidewalls of the patterned pseudo-hardmask, wherein the top thickness is at least twice the sidewall thickness, computer readable code for etching the etch layer through the patterned pseudo-hardmask, and computer readable code for cyclically repeating the conditioning and etching at least twice.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
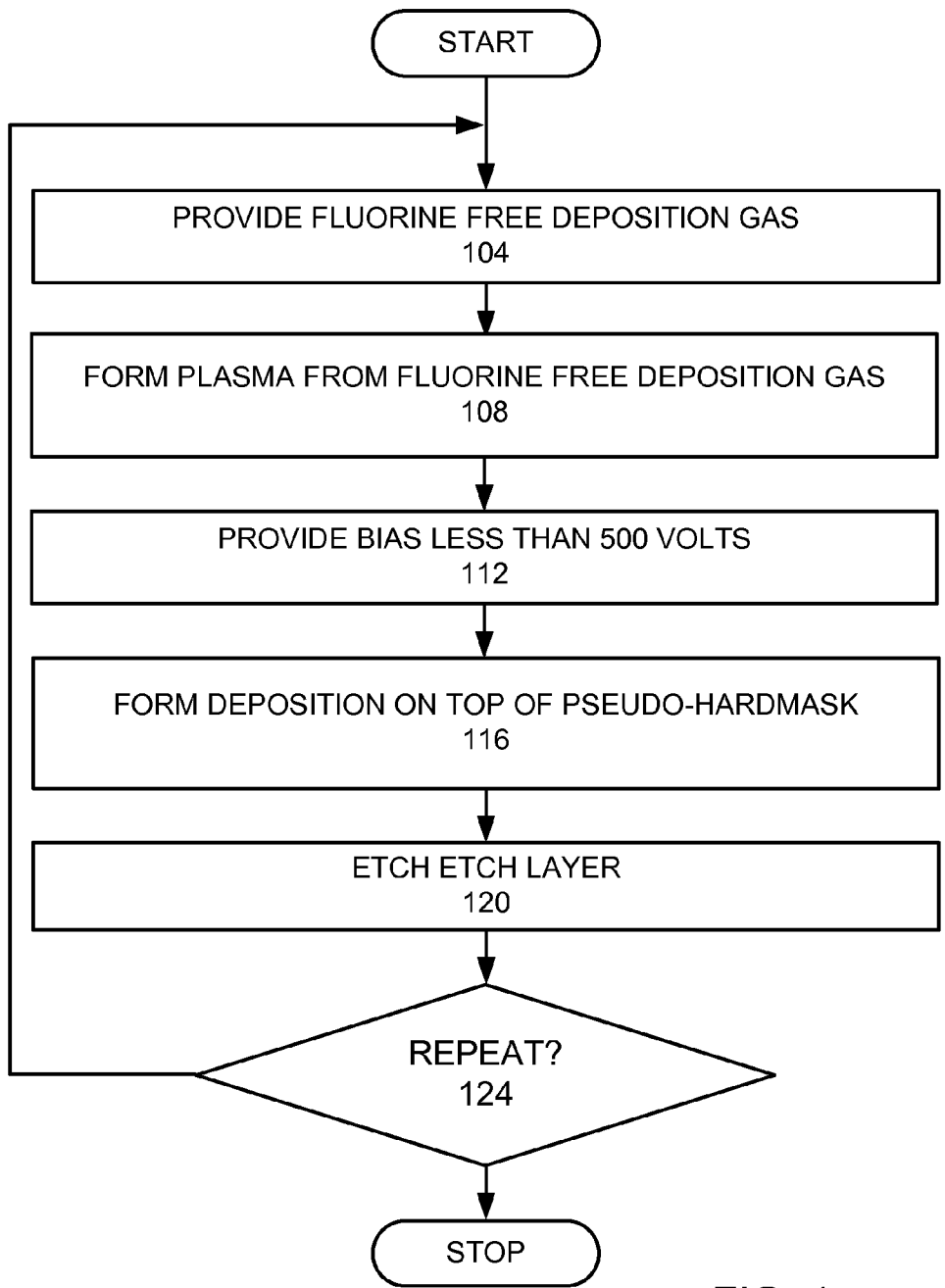
FIG. 1 is a flow chart of an embodiment of the invention.

To facilitate understanding, FIG. 1 is a high level flow chart of a process used in an embodiment of the invention. A method for etching features in an etch layer is provided in a two step process. The first step provides conditioning for a patterned pseudo-hardmask comprising amorphous carbon or polysilicon. The second step provides etching of the etch layer through the pseudo-hardmask. The conditioning provides a fluorine free deposition gas comprising a hydrocarbon gas (step 104). The fluorine free deposition gas is formed into a plasma (step 108). A bias of less than 500 volts is provided (step 112). The plasma and low bias form a deposition on top of the pseudo-hardmask (step 116), which completes the conditioning step. The etch layer is then etched (step 120). In this embodiment the etch etches less than half the thickness of the etch layer. Therefore, the conditioning step and the etch step are repeated at least two times more (step 124).

Example

Figure 2:
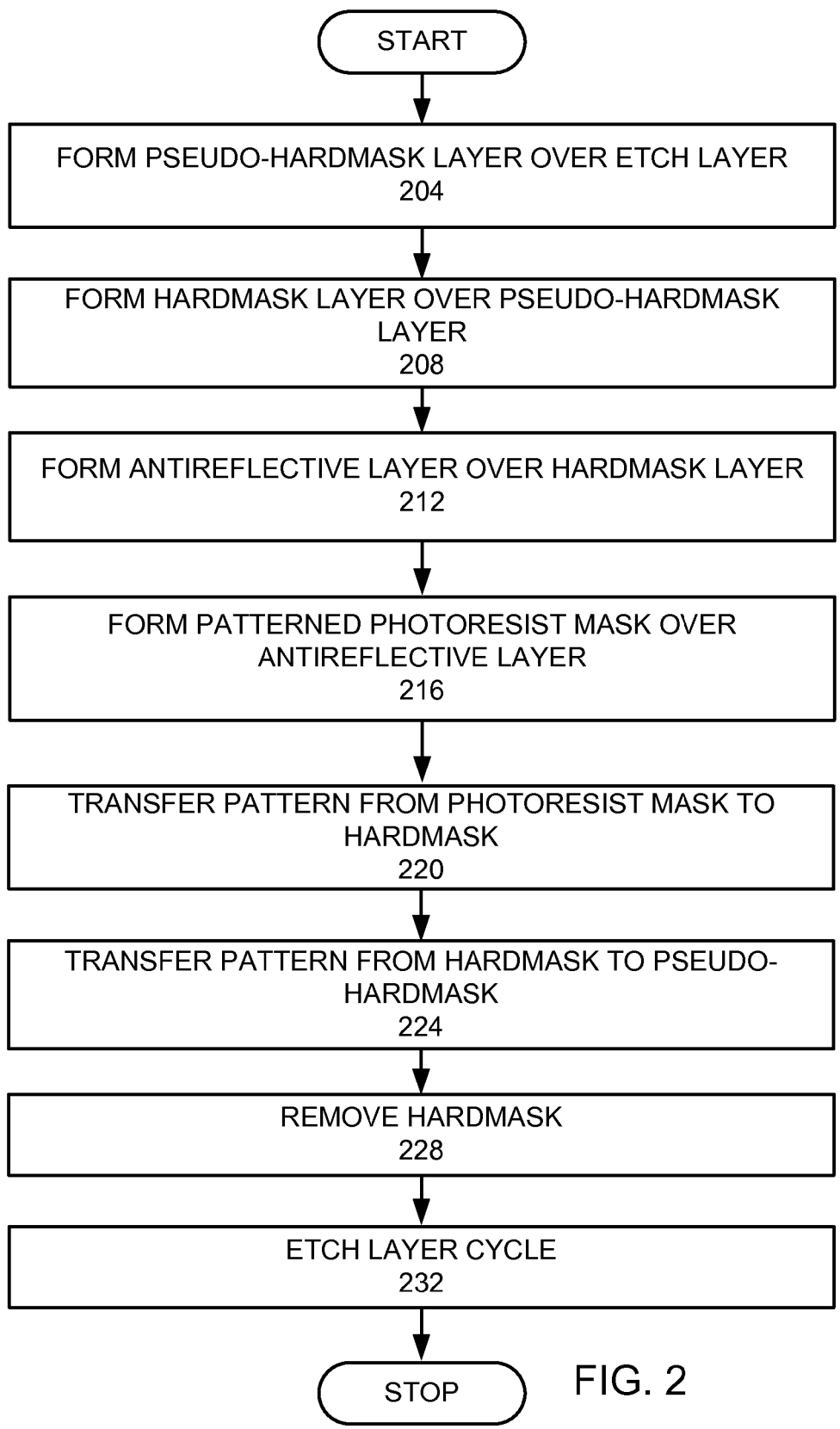
FIG. 2 is a higher level flow chart incorporating the process shown in FIG. 1.
Figure 3A:
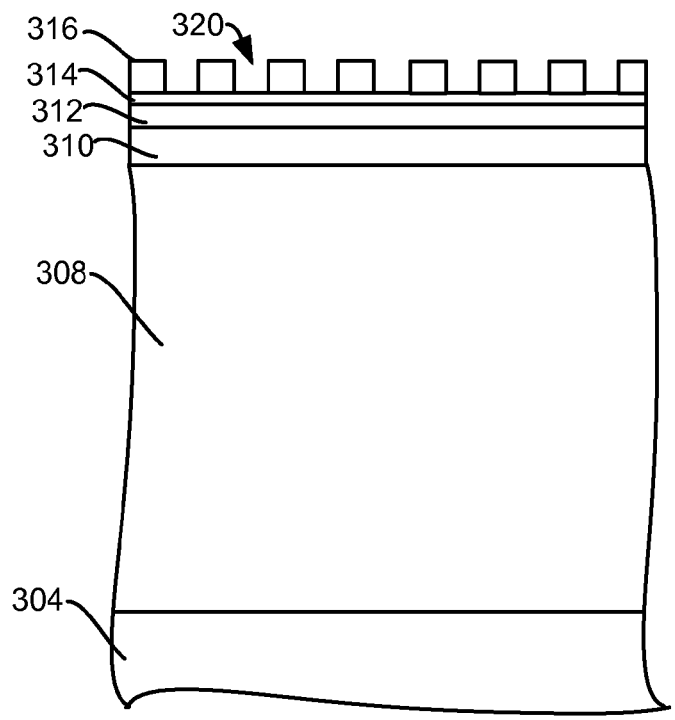
FIGS. 3A-H are schematic views of a stack etched in an embodiment of the invention.

FIG. 2 is a flow chart of an example of the invention. An amorphous carbon layer is formed over an etch layer (step 204). A hardmask layer is formed over the amorphous carbon layer (step 208). An antireflective layer is formed over the hardmask layer (step 212). A photoresist mask is formed over the antireflective layer (step 216). FIG. 3A is a schematic cross-sectional view of a photoresist mask 316 with photoresist mask features 320 formed over and antireflective layer 314, formed over a hardmask layer 312, formed over a pseudo-hardmask layer 310, formed over an etch layer 308 formed over a substrate 304. The antireflective layer may be an inorganic and organic antireflective layer. A common inorganic material used for the inorganic antireflective layer is SiON. In various embodiments, the layers may have one or more additional layers provided between the various layers. For example, one or more layers may be between the etch layer 308 and the substrate 304. The etch layer 308 may be an interlayer dielectric layer where one or more layers of devices may be between the etch layer and the substrate. In another example, a silicon nitride layer may be placed below a silicon oxide layer, which is the etch layer. Preferably, the etch layer is a silicon oxide based material. More preferably, the etch layer further comprises a nitrogen or hydrogen component.

Figure 4:
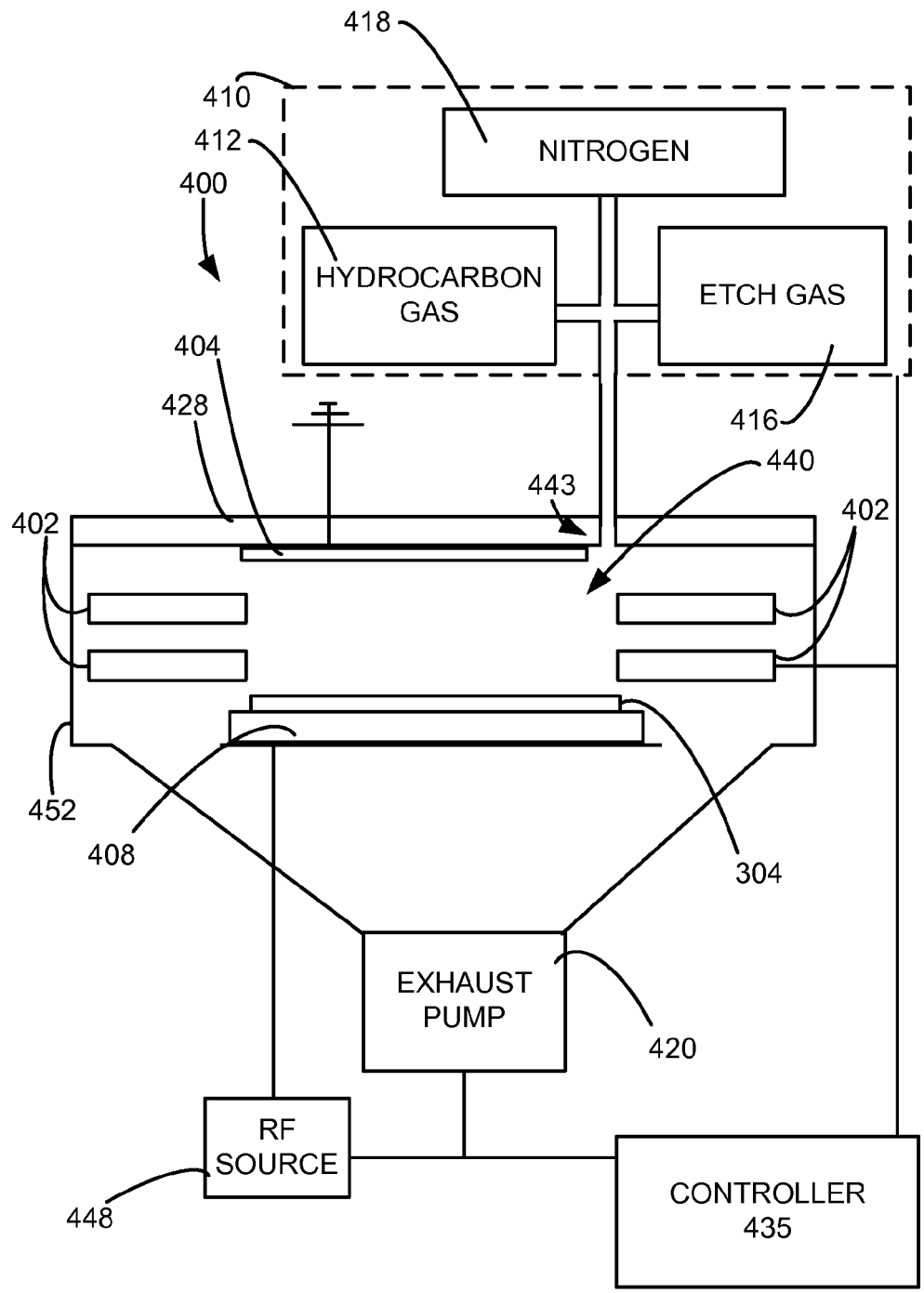
FIG. 4 is a schematic view of a plasma processing chamber that may be used for etching.

The substrate 304 is placed in a plasma processing chamber where one or more steps may be performed. FIG. 4 is a schematic view of a plasma processing chamber 400 that may be used for one or more of the following steps. The plasma processing chamber 400 comprises confinement rings 402 (although other embodiments may use other confinement devices), an upper electrode 404, a lower electrode 408, a gas source 410, and an exhaust pump 420. Within plasma processing chamber 400, the substrate 304 is positioned upon the lower electrode 408. The lower electrode 408 incorporates a suitable substrate chucking mechanism (e.g., electrostatic, mechanical clamping, or the like) for holding the substrate 304. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume 440 through a gas inlet 443 by the gas source 410 and is exhausted from the confined plasma volume through the confinement rings 402 and an exhaust port by the exhaust pump 420. Besides helping to exhaust the gas, the exhaust pump 420 helps to regulate pressure. In this embodiment, the gas source 410 comprises a hydrocarbon gas source 412, a etch gas source 416, and a nitrogen gas source 418. The gas source 410 may further comprise other gas sources. An RF source 448 is electrically connected to the lower electrode 408. Chamber walls 452 surround the confinement rings 402, the upper electrode 404, and the lower electrode 408. Different combinations of connecting RF power to the electrode are possible. In a preferred embodiment, the 27 MHz, 60 MHz and 2 MHz power sources make up the RF power source 448 connected to the lower electrode, and the upper electrode is grounded. A controller 435 is controllably connected to the RF source 448, exhaust pump 420, and the gas source 410. The process chamber can be a: CCP (capacitive coupled plasma) reactor or an ICP (inductive coupled plasma) reactor.

Figure 5A:
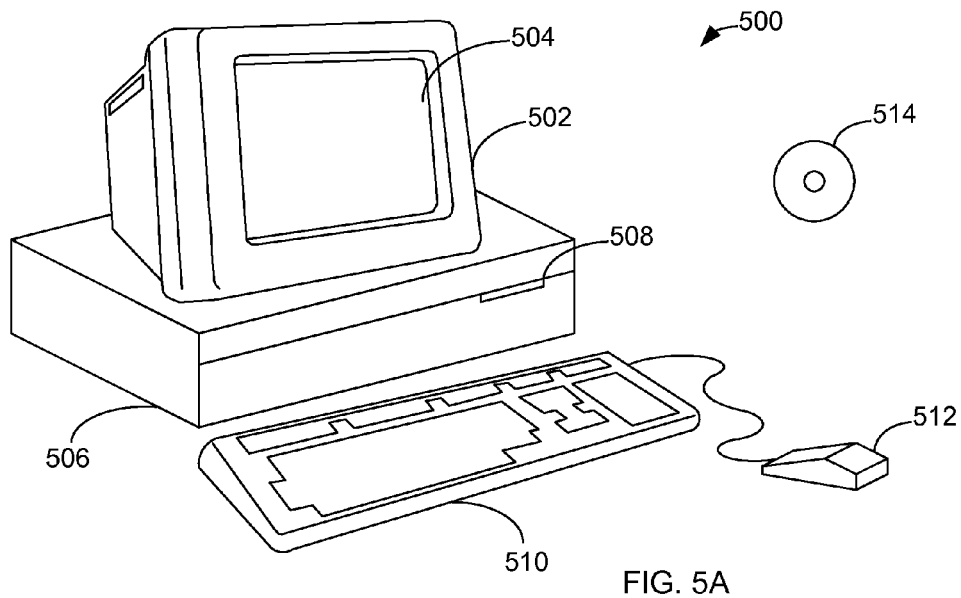
FIGS. 5A-B illustrate a computer system, which is suitable for implementing a controller used in embodiments of the present invention.
Figure 5B:
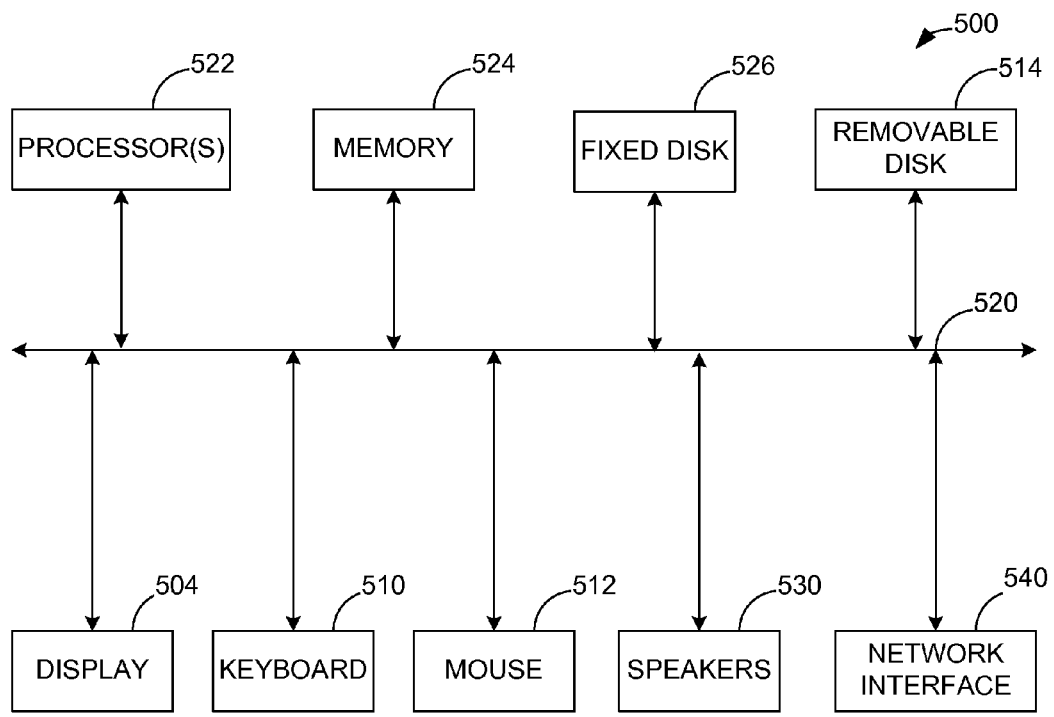

FIGS. 5A and 5B illustrate a computer system 500, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 505, a keyboard 510, and a mouse 512. Disk 514 is a computer-readable medium used to transfer data to and from computer system 500.

FIG. 5B is an example of a block diagram for computer system 500. Attached to system bus 520 are a wide variety of subsystems. Processor(s) 522 (also referred to as central processing units, or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of the computer-readable media described below.

CPU 522 is also coupled to a variety of input/output devices, such as display 504, keyboard 510, mouse 512, and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible non-transitory computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3B:
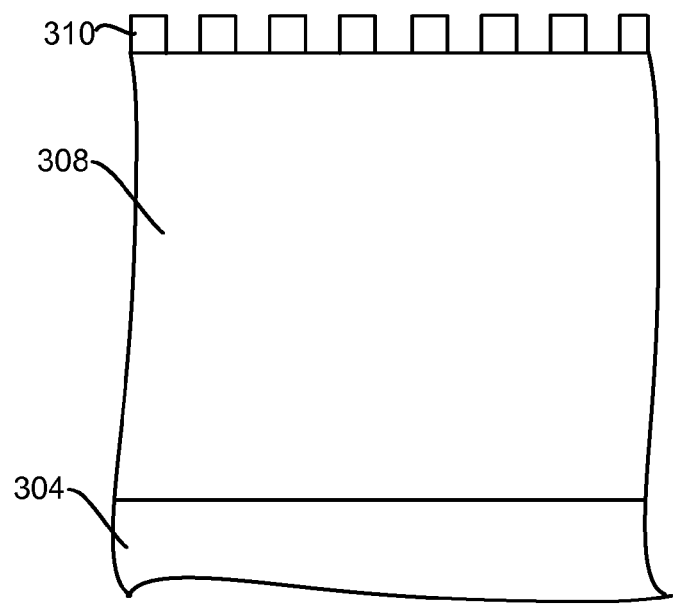

The plasma processing chamber 400 may be used to transfer the pattern from the photoresist mask 316 to the hardmask layer 312 (step 220). The pattern is then transferred from the hardmask 312 to the pseudo-hardmask layer 310 to form a patterned pseudo-hardmask layer (step 224). The hardmask 312 is removed (step 228). FIG. 3B is a schematic cross-sectional view of the substrate 304 after the hardmask is removed. Other embodiments without an intermediate hardmask may transfer a pattern directly from the photoresist to the pseudo-hardmask without first transferring the pattern to a hardmask.

The etch layer cycle is then performed (step 232). In this embodiment, the etch layer cycle is the process of the flowchart shown in FIG. 1. In this example, the etch layer cycle is provided in a two step process. The first step provides conditioning for a patterned pseudo-hardmask comprising amorphous carbon or polysilicon and then an etching of the etch layer. The conditioning provides a fluorine free deposition gas comprising a hydrocarbon gas (step 104). Preferably, the hydrocarbon gas is $C_2H_4$ or $CH_4$. More preferably, the hydrocarbon gas is $C_2H_4$. An example of a deposition gas would provide 1-200 sccm (standard cubic centimeters per minute) of $C_2H_4$, 10-2000 sccm of $N_2$, and 1-200 sccm of $O_2$ at a pressure of 5-100 mTorr. In other embodiments, the fluorine free deposition gas may comprise a silicon containing component. In other embodiments the silicon containing component may be provided by silicon or silicon dioxide chamber parts. A wafer temperature of between −80 deg C. to 120 deg C. is maintained. The fluorine free deposition gas is formed into a plasma (step 108). In this example 0-200 Watt of 2 MHz RF power and 0-600 Watt of 60 MHz RF power is provided. A bias of less than 500 volts is provided (step 112). The conditioning is maintained for between 1-120 seconds. The plasma and low bias form a deposition on top of the pseudo-hardmask (step 116), which completes the conditioning step.

Figure 3C:
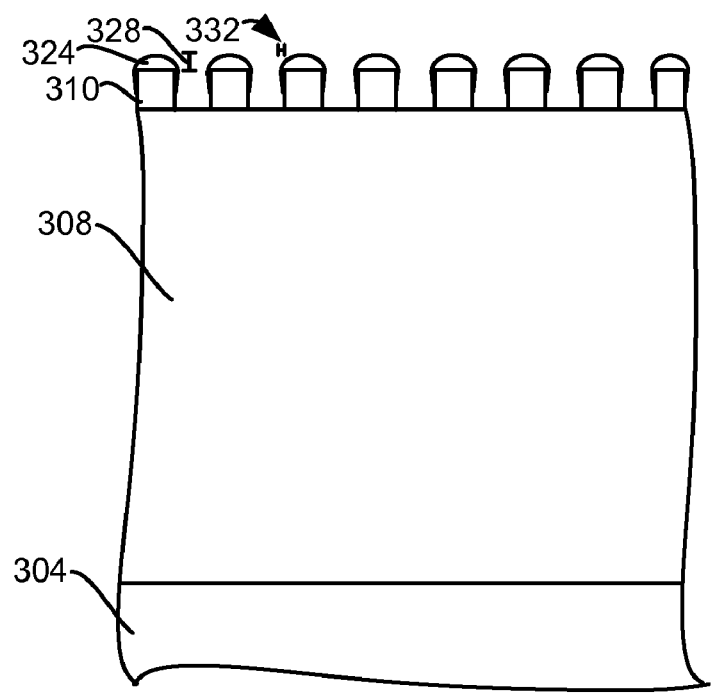

FIG. 3C is a cross-sectional view of the substrate 304 after the conditioning step has formed a deposition 324 on top of the pseudo-hardmask 310. The deposition 324 has a top thickness 328 and a thickness 332 of the thickest part of the sidewall. In this embodiment the top thickness 328 is at least two times the thickness 332 of the thickest part of the sidewall deposition. More preferably, the top thickness 328 is at least five times the thickness of the thickest part of the sidewall deposition 332. In one experiment the thickest part of the sidewall deposition 332 was about 1 nm and the top thickness 328 was greater than 5 nm. In another experiment, the thickest part of the sidewall deposition 332 was less than 1 nm and the top thickness 328 was greater than 2 nm. Therefore, in this second experiment, the thickest part of the top thickness 328 was greater than two times the thickest part of the sidewall deposition 332.

Figure 3D:
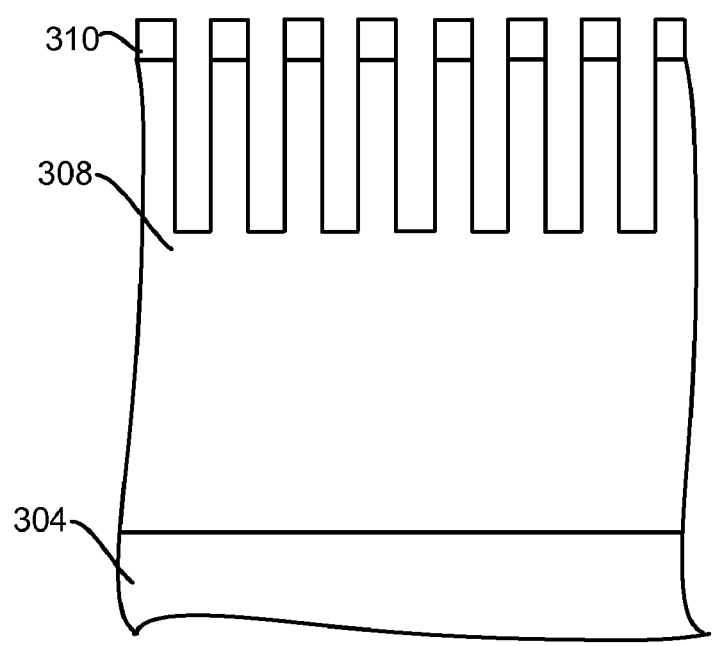

The etch layer is then etched (step 120). In this embodiment the etch etches less than half the thickness of the etch layer. FIG. 3D is a cross-sectional view of the substrate after the etch layer is etched for the first cycle. Although no deposition is shown in FIG. 3D a few angstroms of deposition may remain on top after the etch step. Because the etch etches less than half the thickness of the etch layer, the conditioning step and the etch step are cyclically repeated at least two times more (step 124).

Figure 3E:
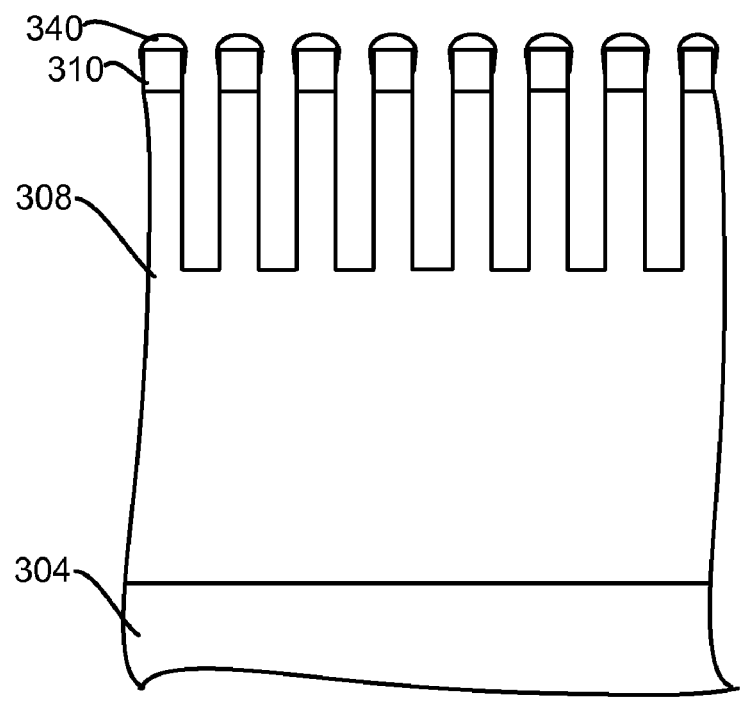
Figure 3F:
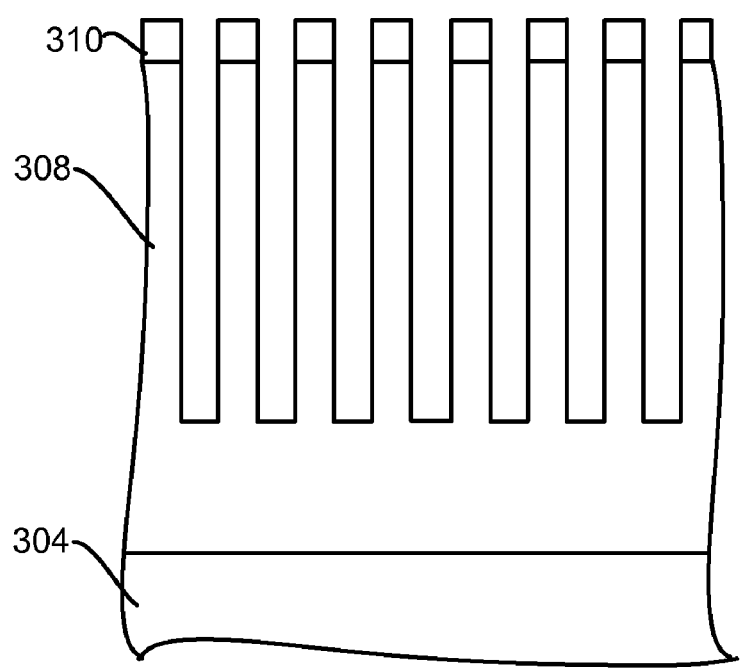
Figure 3G:
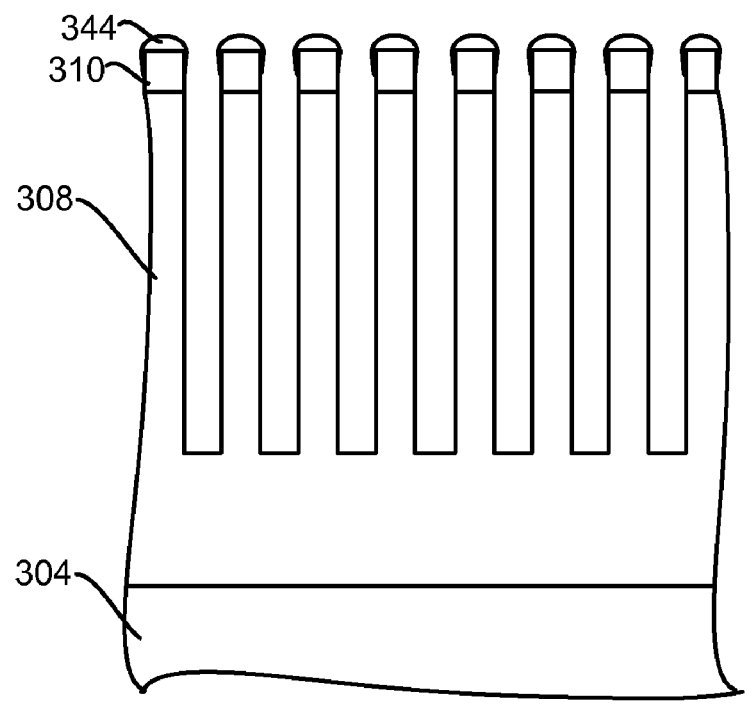
Figure 3H:
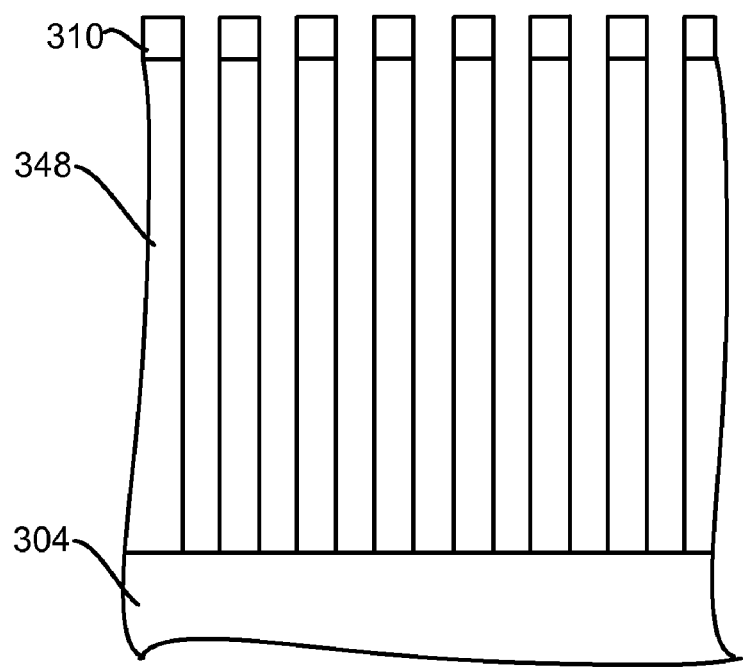

FIG. 3E is a cross-sectional view of the substrate after a deposition in a second cycle forms a top deposition 340. FIG. 3F is a cross-sectional view of the substrate after an etch in the second cycle. FIG. 3G is a cross-sectional view of the substrate after a deposition in a third cycle forms a top deposition 344. FIG. 3H is a cross-sectional view of the substrate 304 after the etch is completed, which forms lines 348 from the etched layer. In every cycle after the etch step, there may be up to 10 angstroms of deposition left on the pseudo-hardmask. After the etch is completed, the pseudo-hardmask 310 may be removed in a separate removal step.

Figure 6:
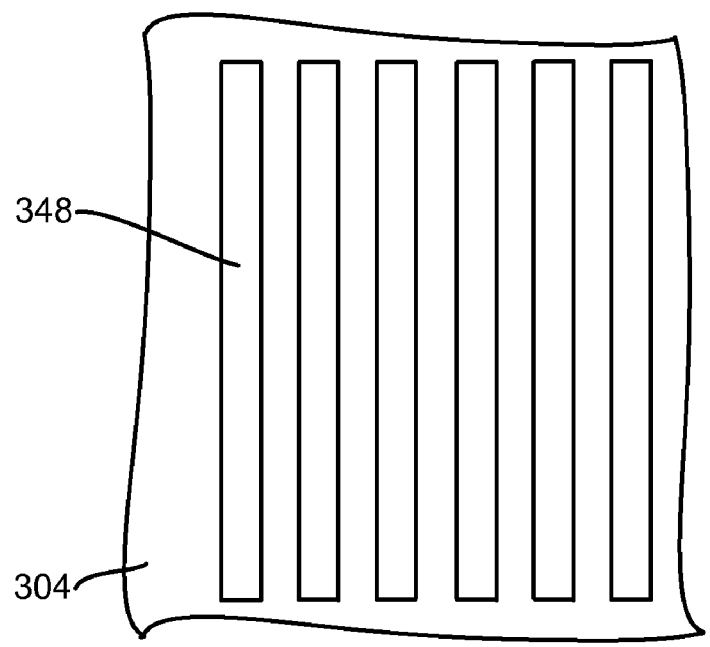
FIG. 6 is a partial top view of the structure shown in FIG. 3H.

The cross-sectional views illustrate the resulting features with reduced wiggling and no CD gain. FIG. 6 is a top view of the formed lines 348. It can be seen by in FIG. 6 that the lines 348 are straight with no or minimal wiggling. In experiments with a plurality of cycles, lines with minimal wiggling were produced.

In this embodiment with an amorphous carbon pseudo-hardmask, the nitrogen has been found to harden the amorphous carbon pseudo-hardmask, to reduce wiggling, without chemically modifying the amorphous carbon material. In addition, the nitrogen is used as a diluent to regulate the concentration of the deposition component to provide the desired deposition. The use of a fluorine free deposition gas, not only provides a protective deposition on top of the pseudo-hardmask, but has also been found to provide a fluorine free deposition. It has been unexpectedly found that a fluorine free deposition scavenges fluorine acting as a fluorine sink in a way that protects the amorphous carbon patterned mask from fluorine attack and reduces or prevents the wiggling of the amorphous carbon mask.

It has been found that during the deposition, providing more RF power with source frequency of at least 60 MHz than RF power with source frequency below 60 MHz improves the deposition process. More preferably, low or no RF power is provided at a frequency below 60 MHz. With such high frequency RF power, the pressure may be kept between 5 and 150 mTorr. It has been found that lower RF frequencies may be used, but higher pressures would be needed to reduce ion damage. For example, a 2 MHz RF power alone would use a pressure above 150 mTorr, such as 500 mTorr. However, it has been found that a high frequency of equal or greater than 60

MHz and low pressure provides reduced ion damage. Preferably, the bias is less than 500 volts. More preferably the bias is less than 300 volts. A low bias further reduces ion damage induced line wiggling.

In another embodiment, the pseudo-hardmask is polysilicon. In such an embodiment, the diluent can be $O_2$ instead of nitrogen, since $O_2$ may be used to both harden the pseudo-hardmask and as a diluent.

Figure 7:
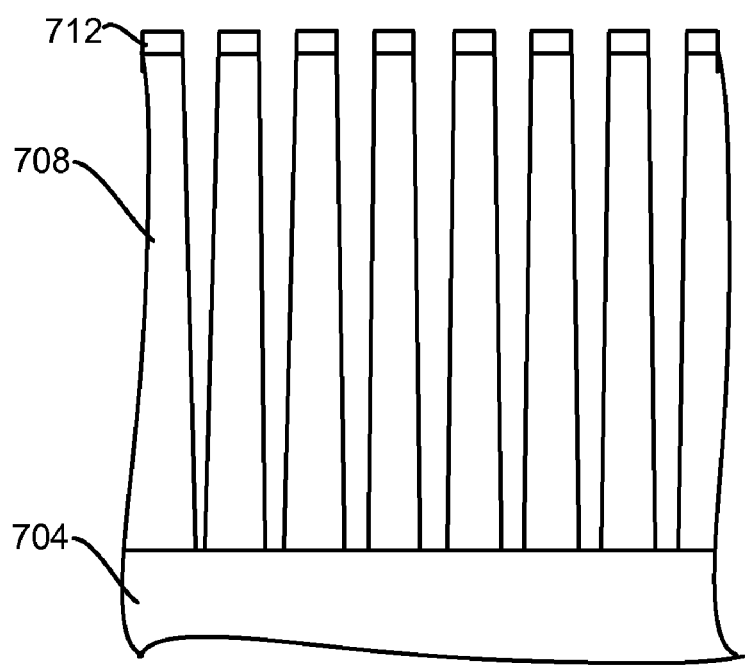
FIG. 7 is a schematic cross-sectional view of a structure etched using a single deposition.
Figure 8:
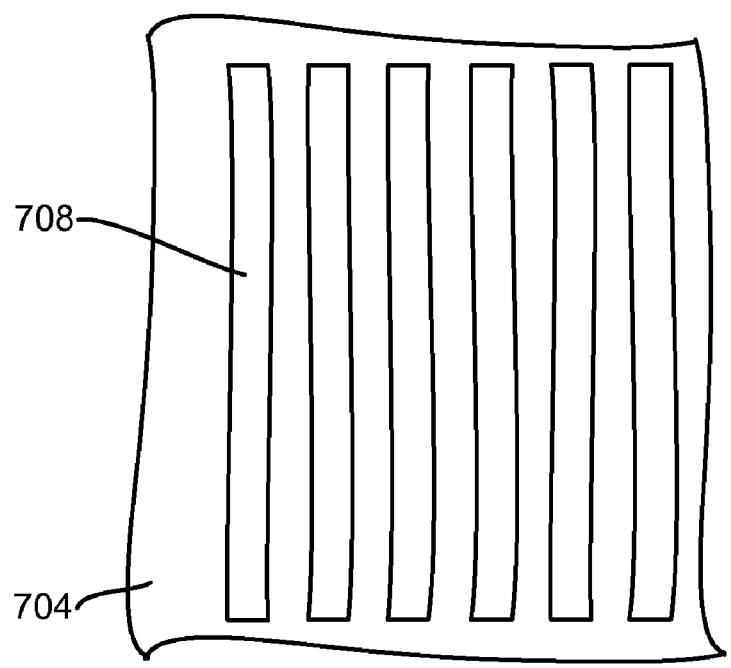
FIG. 8 is a top view of the structure shown in FIG. 7.

Although it is preferable that the deposition and etch cycles are performed at least three times, it is possible to complete an etch using a single deposition. FIG. 7 is a cross-sectional view of lines 708 on a substrate 704, after an etch that uses a single deposition on a pseudo-hardmask 712. The lines 708 have a slight tapper, so that the CD at the bottom of the lines is increased. Without being bound by theory, it is believed that performing a single deposition followed by a subsequent single-step etch that etches the full thickness of the etch layer (708), the shape of the pseudo-hardmask will become tapered during the etch, leading to a tapered sidewall, thus a tapered sidewall in the etch layer and a larger bottom CD as shown in FIG. 7. FIG. 8 is a top view of the lines 708 on the substrate 704. In experiments using a single deposition process, a reduction in wiggling was accomplished, although there was some wiggling in the lines.

Figure 9:
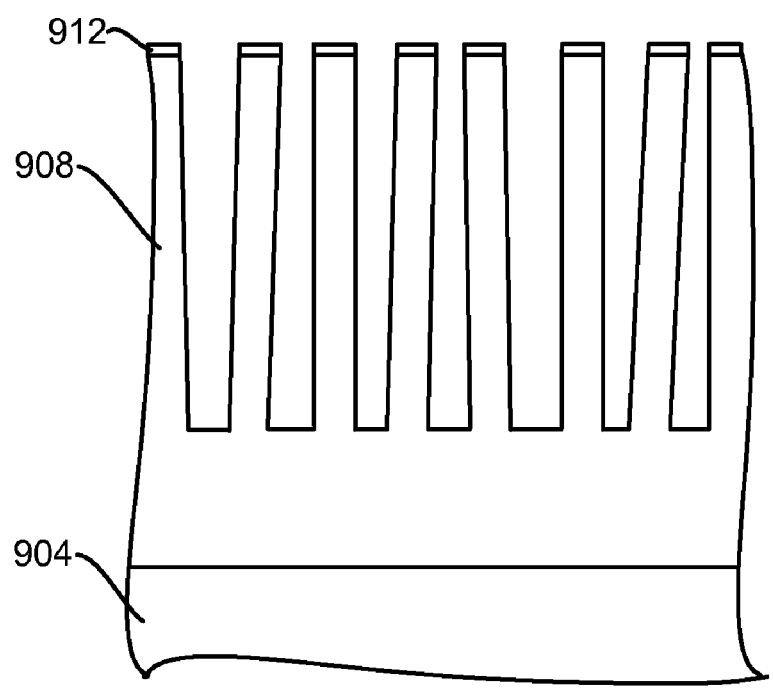
FIG. 9 is a schematic cross-sectional view of a structure etched without a conditioning step.
Figure 10:
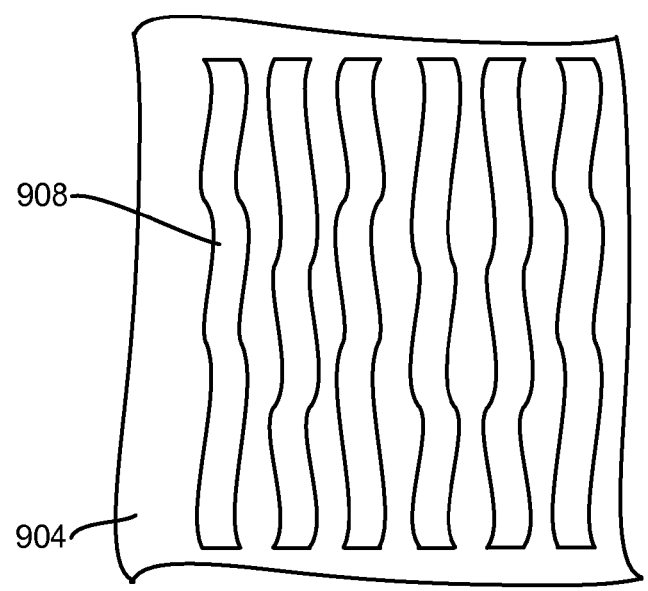
FIG. 10 is a top view of the structure shown in FIG. 9.

FIG. 9 is a cross-sectional view of lines 908 on a substrate 904 after an etch process that does not provide a deposition over a pseudo-hardmask 912. FIG. 10 is a top view of the lines 908 on the substrate 904. This illustration shows that without a conditioning step significant wiggling results.

An alternative etch process may provide a passivation gas during the etch. It has been found that an etch process that provides a passivation gas during the etch increases the CD of the lines.

By reducing or eliminating wiggling, the inter-device and intra-device yield may be increased. The reduction of pseudo-hardmask wiggling provides line features with a CD of less than 20 nm and a thickness (or height) greater 100 nm, which may be up to 250 nm.

While this invention has been described in terms of several preferred embodiments, there are alterations, permutations modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in an etch layer, comprising:
    a) providing a conditioning for a patterned pseudo-hardmask of amorphous carbon or polysilicon disposed over the etch layer, wherein the conditioning comprises:
    providing a fluorine free deposition gas comprising a hydrocarbon gas;
    then forming a plasma from the fluorine free deposition gas;
    providing a bias less than 500 volts; and
    then forming a deposition on top of the patterned pseudo-hardmask;
    b) then etching the etch layer through the patterned pseudo-hardmask; and
    then removing the pseudo-hardmask layer after etching the etch layer.

2. The method, as recited in claim 1, further comprising repeating steps a and b at least twice and wherein the deposition has a top thickness, which is a thickness of the deposition on top of the patterned pseudo-hardmask and a sidewall thickness, which is the maximum thickness on sidewalls of the patterned pseudo-hardmask, wherein the top thickness is at least twice the sidewall thickness.

3. The method, as recited in claim 2, wherein the pseudo-hardmask is polysilicon and wherein the fluorine free deposition gas further comprises oxygen.

4. The method, as recited in claim 2, wherein the etching the etch layer forms a plurality of lines in the etch layer, wherein the lines have widths of no more than 20 nm and thicknesses of at least 100 nm.

5. The method, as recited in claim 2, further comprising:
    forming an amorphous carbon layer over the etch layer;
    forming an antireflective layer over the pseudo-hardmask layer;
    forming a patterned photoresist layer over the antireflective layer; and
    transferring a pattern of the patterned photoresist layer to the pseudo-hardmask layer.

6. The method, as recited in claim 2, wherein the pseudo-hardmask is amorphous carbon and wherein the fluorine free deposition gas further comprises nitrogen.

7. The method, as recited in claim 6, wherein the top thickness is at least five times the maximum thickness on the sidewalls.

8. The method, as recited in claim 7, wherein the hydrocarbon gas comprises $C_2H_4$ or $CH_4$.

9. The method, as recited in claim 8, wherein the etch layer is a silicon oxide based material.

10. The method, as recited in claim 9, wherein the etch layer further comprises nitrogen and hydrogen.

11. The method, as recited in claim 8, further comprising:
    forming an amorphous carbon layer over the etch layer;
    forming an antireflective layer over the pseudo-hardmask layer;
    forming a patterned photoresist layer over the antireflective layer; and
    transferring a pattern of the patterned photoresist layer to the pseudo-hardmask layer.

12. The method, as recited in claim 8, wherein the fluorine free deposition gas further comprises silicon containing component.

13. The method, as recited in claim 8, wherein the forming a plasma from the fluorine free deposition gas comprises providing an RF signal of at least 60 MHz and a pressure of less than 5 mTorr.

14. The method, as recited in claim 8, wherein the forming a plasma from the fluorine free deposition gas comprises providing an RF signal of less than 20 MHz and a pressure of greater than 100 mTorr.

15. The method, as recited in claim 8 wherein the bias is less than 300 volts.

16. A method for etching features in an etch layer, comprising:
    a) forming an amorphous carbon layer over the etch layer;
    b) then forming an antireflective layer over the amorphous carbon layer;
    c) then forming a patterned photoresist layer over the antireflective layer;
    d) then transferring a pattern of the patterned photoresist layer to the amorphous carbon layer to form a patterned amorphous carbon mask;
    e) then providing a conditioning for the patterned amorphous carbon mask, wherein the conditioning comprises:

providing a fluorine free deposition gas comprising nitrogen and a hydrocarbon gas comprising $C_2H_4$ or $CH_4$;

forming a plasma from the fluorine free deposition gas; and forming a deposition on top of the patterned amorphous carbon mask wherein the deposition has a top thickness, which is a thickness of the deposition on top of the patterned amorphous carbon mask and a sidewall thickness, which is the maximum thickness on sidewalls of the patterned amorphous carbon mask, wherein the top thickness is at least twice the sidewall thickness; and f) then etching the etch layer through the patterned amorphous carbon mask, wherein steps e and f are cyclically repeated a plurality of times;

g) then removing the patterned amorphous carbon mask.

17. The method, as recited in claim 16, wherein the providing the conditioning further comprises providing a bias less than 500 volts.

* * * * *